United States Patent
Park et al.

(10) Patent No.: US 8,598,911 B2
(45) Date of Patent: Dec. 3, 2013

(54) PULSE WIDTH FILTER

(75) Inventors: Sung-Yun Park, Bucheon (KR); Kunhee Cho, Seoul (KR); Dong-Hwan Kim, Bucheon (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 94 days.

(21) Appl. No.: 13/080,471

(22) Filed: Apr. 5, 2011

(65) Prior Publication Data

US 2011/0267109 A1 Nov. 3, 2011

(30) Foreign Application Priority Data

Apr. 29, 2010 (KR) .......................... 10-2010-0040149

(51) Int. Cl.
*G01R 29/02* (2006.01)
*H03K 9/08* (2006.01)
(52) U.S. Cl.
USPC .............................................. 327/34; 327/552
(58) Field of Classification Search
USPC ............................................. 327/34, 552, 558
See application file for complete search history.

(56) References Cited

U.S. PATENT DOCUMENTS

| 3,676,699 A | 7/1972 | Warren |
| 5,151,612 A * | 9/1992 | Ishikawa .......................... 327/34 |
| 7,187,213 B2 | 3/2007 | Yoshida et al. |

* cited by examiner

*Primary Examiner* — Lincoln Donovan
*Assistant Examiner* — Diana J Cheng
(74) *Attorney, Agent, or Firm* — Okamoto & Benedicto LLP

(57) ABSTRACT

The present invention relates a pulse width filter generating a modulation signal that is increased in synchronization with one of an increasing edge and a decreasing edge of the input signal and is decreased in synchronization with the other of the increasing edge and the decreasing edge, and transmitting the input signal of the modulation signal. The input signal passed through the filter unit is inverted thereby being an output signal. The pulse width filter controls the increasing and the decreasing of the modulation signal according to the output signal and the input signal passed through the filter unit, and the modulation signal is a signal to determined whether the pulse width of the input signal is more than the predetermined cut-off pulse width.

22 Claims, 6 Drawing Sheets

PULSE WIDTH FILTER

CROSS-REFERENCE TO RELATED APPLICATION

This application claims priority to and the benefit of Korean Patent Application No. 10-2010-0040149 filed in the Korean Intellectual Property Office on Apr. 29, 2010, the entire contents of which are incorporated herein by reference.

BACKGROUND OF THE INVENTION (a) Field of the Invention

The present invention relates to a pulse width filter and a filtering method. Particularly, the present invention relates to a pulse width filter preventing distortion of an input signal.

(b) Description of the Related Art

Generally, a pulse width filter transmits a pulse of an input signal when a pulse width of the input signal is more than a cut-off pulse, and does not transmit the pulse of the input signal when it is less than the cut-off pulse. The pulse width filter may be realized by using a resistor-capacitor (RC) filter.

When the pulse width of the input signal is significantly more than the cut-off pulse, the pulse of the input signal is passed through the pulse width filter without the distortion. However, when the pulse width of the input signal is slightly more than the cut-off pulse, the pulse of the input signal is distorted and is passed through the pulse width filter.

When the input signal transmits through the RC filter, a charging period in which the capacitor of the RC filter is charged and a discharging period in which the capacitor of the RC filter is discharged are generated.

For example, it is assumed that the RC filter includes an inverter input with the voltage of the capacitor, the inverter inverts the output with reference to the voltage of 2.5V, and the capacitor may be charged to 5V. The capacitor voltage starts to increase from 0V from the increasing edge of the input signal. The capacitor voltage starts to decrease from the decreasing edge of the input signal. If the capacitor voltage is more than 2.5V, the inverter outputs a low level, and if it is less than 2.5V, it outputs a high level.

If the pulse width of the input signal is sufficiently longer than the cut-off pulse, the capacitor voltage is increased to 5V, and then is decreased to 0V. Here, an increasing delay period is determined as a period that the capacitor voltage is increased from 0V to 2.5V, and a decreasing delay period is determined as a period in which the capacitor voltage is decreased from 5V to 2.5V. Accordingly, the increasing delay period and the decreasing delay period are equal to each other, and the input signal is transmitted through the RC filter without the distortion.

However, when the pulse width of the input signal is less than the cut-off pulse, the capacitor voltage cannot be increased to 5V. When the capacitor voltage reaches 2.7V, if the decreasing time of the input signal is generated, when the capacitor voltage reaches 2.5V, the inverter changes the output signal to the high level. That is, the increasing delay period is a period in which the capacitor voltage is increased from 0V to 2.5V, and the decreasing delay period is a period in which the capacitor voltage is decreased from 2.7V to 2.5V. Accordingly, the increasing delay period and the decreasing delay period are different from each other such that the input signal is distorted and transmits through the RC filter.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a pulse width filter that is capable of outputting a pulse of more than a cut-off pulse without distortion.

A pulse width filter according to the present invention includes: a filter unit generating a modulation signal that is increased in synchronization with one of an increasing edge and a decreasing edge of an input signal and decreased in synchronization with one of the increasing edge and the decreasing edge, and transmitting the input signal according to the modulation signal; and an output inverter inverting the input signal passing through the filter unit to generate an output signal, wherein the increasing and the decreasing of the modulation signal is controlled according to the input signal passed through the output signal and the filter unit, and the modulation signal is a signal to determine whether the pulse width of the input signal is more than a predetermined cut-off pulse width.

The filter unit may include: an increasing circuit supplying a source current or a first voltage to a first input signal inverting the input signal and the output signal; a decreasing circuit supplying a sink current or a second voltage according to the first input signal and a second input signal that is an input signal passing through the filter unit; and a controller receiving the source current, the sink current, the first voltage, and the second voltage according to the second input signal and the output signal to generate the modulation signal. The controller may increase the modulation signal by using the source current in synchronization with the increasing edge of the input signal, and decreases the modulation signal by using the sink current in synchronization with the decreasing edge of the input signal. The controller may increase the modulation signal during an increasing delay period by using the source current in synchronization with the increasing edge of the input signal and then maintains the modulation signal as a first voltage, and decreases the modulation signal during a decreasing delay period by using the sink current in synchronization with the decreasing edge of the input signal, and then maintains the modulation signal as the second voltage when the input signal is more than the cut-off pulse width. The increasing circuit may include: a first transistor including a gate electrode transmitted with the first input signal, a drain electrode connected to the controller, and source electrode; and a first resistor including one terminal connected to the first voltage and the other terminal connected to the source electrode of the first transistor, and the first transistor may be turned on by the first level of the first input signal. The decreasing circuit may include: a second transistor including a gate electrode transmitted with the first input signal, a drain electrode connected to the controller, and a source electrode; a second resistor including one terminal connected to the second voltage and the other terminal connected to the source electrode of the second transistor; and the second transistor may be turned on by the second level of the first input signal.

The controller may include: a first capacitor; a second capacitor; a first switch including one terminal connected to an input node connected to the increasing circuit and the decreasing circuit and the other terminal connected to one terminal of the first capacitor, and switched according to the output signal; a second switch including one terminal input with the first voltage and the other terminal connected to one terminal of the first capacitor, and switched according to the second input signal; a third switch including one terminal connected to the input node and the other terminal connected to one terminal of the second capacitor, and switched according to the second input signal; a fourth switch connected in parallel to the second capacitor and switched according to the output signal; and an inverter including an input terminal connected to the input node and an output terminal connected to the output node connected to the output inverter, wherein the voltage of the input node may be the modulation signal, and the modulation signal may be inverted through the inverter thereby being the second input signal. The decreasing circuit may include one terminal connected to the second voltage and the other terminal connected to the source electrode of the second transistor, and may further include a switch operated according to the second input signal.

The increasing circuit may include one terminal connected to the first voltage and the other terminal connected to the source electrode of the first transistor, and may further include a switch operated according to the output signal. If the increasing modulation signal reaches the cut-off pulse voltage corresponding to the cut-off pulse width, the inverter may invert the modulation signal to generate the second input signal of the low level, and if the decreasing modulation signal reaches the cut-off pulse voltage, the inverter may invert the modulation signal to generate the second input signal of the high level. The filter unit may include: an increasing circuit increasing the modulation signal in synchronization with the decreasing edge of the input signal; a decreasing circuit decreasing the modulation signal in synchronization with the increasing edge of the input signal; a controller generating the first pulse signal and the second pulse signal output signal controlling the operation of the increasing circuit and the decreasing circuit; and a capacitor connected to the increasing circuit and the decreasing circuit.

The controller may generate the first pulse signal having the high level of a predetermined period in synchronization with the decreasing edge of the output signal, and may generate the second pulse signal having the high level of a predetermined period in synchronization with the increasing edge of the output signal. The increasing circuit may charge the capacitor by using at least one of a source current and a first voltage according to the input signal and the first pulse signal. The increasing circuit may include: a current source supplying the source current; a transistor including a gate electrode transmitted with the input signal, a drain electrode connected to one terminal of the capacitor, and a source electrode connected to the current source; and a switch connected between one terminal of the capacitor and the first voltage, and switch-operated according to the first pulse signal.

The decreasing circuit may discharge the capacitor by using at least one of a sink current and a second voltage according to the input signal and the second pulse signal. The decreasing circuit may include: a current source generating the sink current; a transistor including a gate electrode transmitted with the input signal, a drain electrode connected to one terminal of the capacitor, and a source electrode connected to the current source; and a switch connected between one terminal of the capacitor and the second voltage, and operated according to the second pulse signal.

The increasing circuit may charge the capacitor by using at least one of a first source current and a first sink current according to the input signal and the first pulse signal. The increasing circuit may include: a current source generating the first source current; a current mirror unit mirroring the first sink current to generate a second source current; a first transistor including a gate electrode transmitted with the input signal, a drain electrode connected to one terminal of the capacitor, and a source electrode connected to the current source; and a second transistor including a gate electrode transmitted with the first pulse signal, a source electrode connected to a sink current source generating the first sink current, and a drain electrode connected to the current mirror unit. The current mirror unit may mirror the first sink current during the on period of the second transistor to generate the second source current, to transmit the second source current to the capacitor.

The decreasing circuit may discharge the capacitor by using at least one of a first sink current and a second sink current according to the input signal and the second pulse signal. The decreasing circuit may include: a current source generating the first sink current; a first current mirror unit mirroring the second sink current to generate a first source current; a second current mirror unit mirroring the first source current to generate a third sink current; a first transistor including a gate electrode transmitted with the input signal, a drain electrode connected to one terminal of the capacitor, and a source electrode connected to the current source; and a second transistor including a gate electrode transmitted with the second pulse signal, a source electrode connected to a sink current source generating the second sink current, and a drain electrode connected to the first current mirror unit.

The first current mirror unit may mirror the second sink current to generate the first source current during an on period of the second transistor and to transmit the second current mirror unit, and the second current mirror unit may mirror the first source current to generate the third sink current flowing from the capacitor.

The present invention provides a pulse width filter that is capable of outputting an input pulse that is more than the cut-off pulse without distortion.

DETAILED DESCRIPTION OF THE EMBODIMENTS

Figure 1:
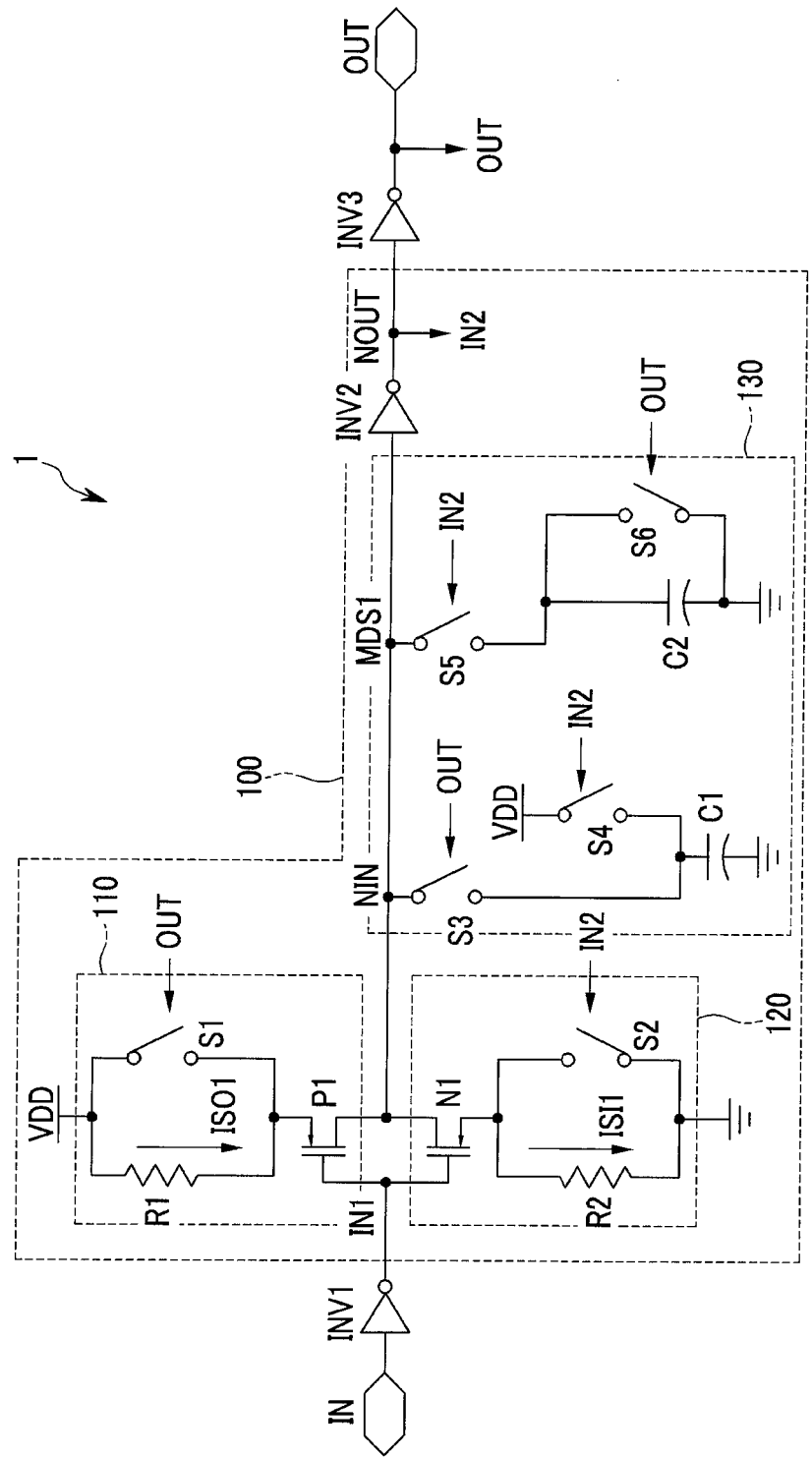
FIG. 1 is a view of a pulse width filter according to the first exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Exemplary embodiments of the present invention that can be realized by a person skilled in the art will now be described with reference to drawings.

FIG. 1 is a view of a pulse width filter according to the first exemplary embodiment of the present invention.

As shown in FIG. 1, a pulse width filter 1 includes an input inverter INV1, a filter unit 100, and an output inverter INV3.

The input inverter INV1 inverts an input signal IN to generate a signal IN1. The inverted signal IN1 is referred to as the first input signal IN1.

The filter unit 100 generates a modulation signal MDS to determine whether the pulse width of the input signal IN is more than the cut-off pulse width. The filter unit 100 transmits the input signal IN according to the modulation signal MDS1. The input signal IN transmitted through the filter unit 100 is referred to as the second input signal IN2. The filter unit 100 according to the first exemplary embodiment of the present invention generates the modulation signal MDS by using the first input signal IN1, the second input signal IN2, and the output signal OUT.

The output inverter INV3 inverts the second input signal IN2 to generate an output signal OUT. Accordingly, the second input signal IN2 and the output signal OUT are the inverted signals with respect to each other.

The filter unit 100 includes an increasing circuit 110 increasing and maintaining the modulation signal MDS1, a decreasing circuit 120 decreasing and maintaining the modulation signal MDS1, a controller 130, and a filter inverter INV2.

The increasing circuit 110 supplies a source current ISO1 or a voltage VDD to the controller 130 according to the first input signal IN1 and the output signal OUT. The source current ISO1 generates by the voltage VDD. A period in which the source current ISO1 is supplied to the controller 130 from the increasing circuit 110 is referred to as an increasing delay period.

The increasing circuit 110 includes a transistor P1, a resistor R1, and a switch S1. The transistor P1 includes a gate electrode transmitted with the first input signal IN1, a drain electrode connected to the controller 130, and a source electrode. The resistor R1 includes one terminal connected to the voltage VDD and the other terminal connected to the source electrode of the transistor P1. The switch S1 includes one terminal connected to the voltage VDD and the other terminal connected to the source electrode of the transistor P1, and is operated according to the output signal OUT. If the output signal OUT is the high level, the switch S1 is turned on, and the voltage VDD is supplied to the controller 130 through the turned on transistor P1.

The decreasing circuit 120 supplies the sink current ISM or the ground voltage to the controller 130 according to the first input signal IN1 and the second input signal IN2. The sink current ISI1 is generated by the ground voltage. A period in which the sink current ISI1 flows is referred to as a decreasing delay period. In an exemplary embodiment of the present invention, the ground voltage is determined as one example of the voltage of the level that is less than the voltage VDD, however the present invention is not limited thereto.

The decreasing circuit 120 includes a transistor N1, a resistor R2, and a switch S2. The transistor N1 includes a gate electrode transmitted with the first input signal IN1, a drain electrode connected to the controller 130, and a source electrode. The resistor R2 included one terminal that is grounded and the other terminal connected to the source electrode of the transistor N1. The switch S2 includes one terminal that is grounded and the other terminal connected to the source electrode of the transistor N1, and is operated according to the second input signal IN2. If the second input signal IN2 is the high level, the switch S2 is turned on such that the controller 130 is grounded.

The controller 130 receives a source current ISO1, a sink current ISI1, voltage VDD, and a ground voltage that are supplied from the increasing circuit 110 or the decreasing circuit 120 according to the second input signal IN2 and the output signal OUT to generate the modulation signal MDS1.

When the input signal IN is larger than the cut-off pulse width, the controller 130 increases the modulation signal MDS1 during the increasing delay period by using the source current ISO1 in synchronization with the increasing edge of the input signal IN, and then maintains the modulation signal MDS1 as the voltage VDD. The controller 130 decreases the modulation signal MDS1 during the decreasing delay period by using the sink current ISI1 in synchronization with the decreasing edge of the input signal IN, and then maintains the modulation signal MDS1 as the ground voltage.

If the input signal IN is not maintained with the high level during the increasing delay period, the modulation signal MDS1 is not increased to the cut-off pulse voltage. For example, the modulation signal MDS1 starts to increase the ground voltage from the low level in an exemplary embodiment of the present invention in synchronization with the increasing edge of the input signal IN. However, if the decreasing edge of the input signal IN is generated within the increasing delay period, the modulation signal MDS1 is not increased to the cut-off pulse voltage and is decreased.

If the input signal IN is not maintained as the low level during the decreasing delay period, the modulation signal MDS1 is not decreased to the cut-off pulse voltage. For example, the modulation signal MDS1 starts to decreased from the high level the voltage VDD in an exemplary embodiment of the present invention in synchronization with the decreasing edge of the input signal IN. However, if the increasing edge of the input signal IN is generated within the decreasing delay period, the modulation signal MDS1 is not decreased to the cut-off pulse voltage and is increased.

As described above, when the input signal IN is the pulse signal that is less than the cut-off pulse width of which the increasing edge or the decreasing edge is often generated, the modulation signal does not reach the cut-off pulse voltage according to the increasing edge or the decreasing edge of the input signal IN. Thus, the second input signal IN2 output from the controller 130 maintains the current state without the influence of the increasing edge or the decreasing edge of the input signal IN. Accordingly, the input signal IN does not pass through the pulse width filter 1.

The controller 130 includes four switches S3-S6, two capacitors C1 and C2, and an inverter INV2. The controller 130 further includes an input node NIN connected to the increasing circuit 110 and the decreasing circuit 120, and an output node NOUT connected to the output inverter INV3.

The switch S3 includes one terminal connected to the input node NIN and the other terminal connected to one terminal of the capacitor C1. The switch S4 includes one terminal input with the voltage VDD and the other terminal connected to one terminal of the capacitor C1.

The switch S5 includes one terminal connected to the input node NIN and the other terminal connected to one terminal of the capacitor C2. The switch S6 is connected in parallel to the capacitor C2.

The other terminal of the capacitor C1 and the capacitor C2 is grounded.

The inverter INV2 includes an input terminal connected to the input node NIN and an output terminal connected to the output node NOUT, and inverts the voltage of the input node NIN to transmit it to the output node NOUT. The voltage of the input node NIN is the modulation signal MDS1.

Next, an operation of a pulse width filter 1 according to the first exemplary embodiment of the present invention will be described with reference to FIG. 2.

Figure 2:
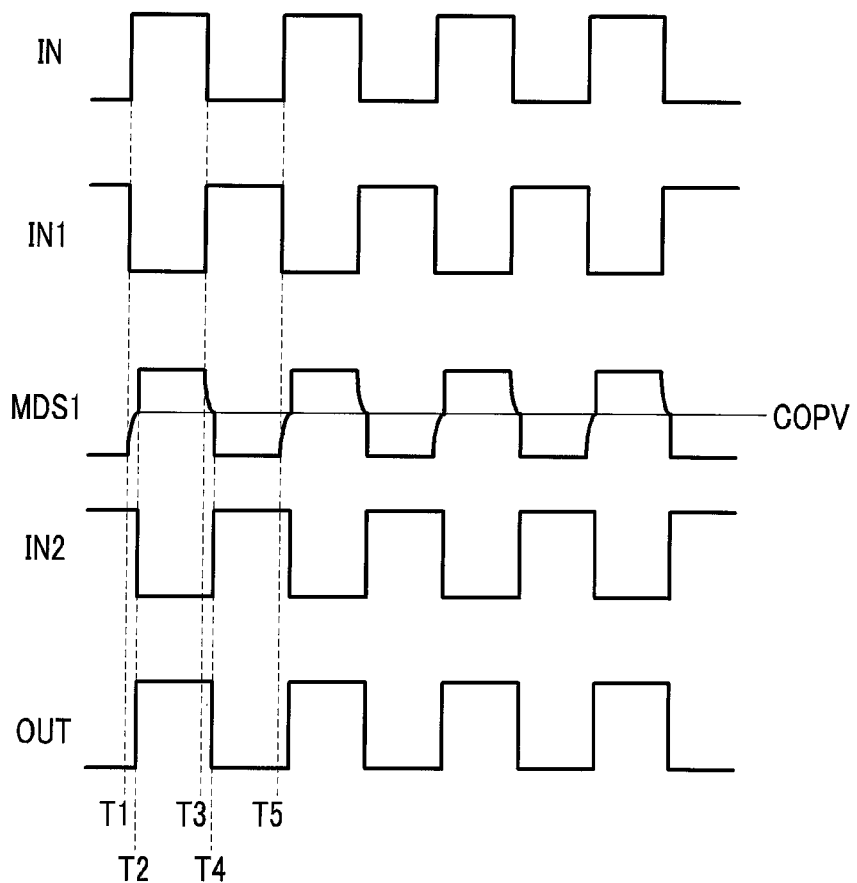
FIG. 2 is a waveform diagram of a signal of a pulse width filter according to the first exemplary embodiment of the present invention.

FIG. 2 is a waveform diagram of signals of a pulse width filter according to the first exemplary embodiment of the present invention.

At a time T1, the input signal IN is increased such that the increasing edge is generated and is maintained as the high level during the period T1-T3.

The inverter INV1 generates the first input signal IN1 of the low level during the period T1-T3.

If the first input signal IN1 is decreased thereby becoming the low level at the time T1, the transistor P1 is turned on, and the transistor N1 is turned off. Here, the output signal OUT is the low level such that the switch S1, the switch S3, and the switch S6 are in the off state, and the second input signal IN2 is the high level such that the switch S4 and the switch S5 are in the on state.

The voltage VDD is connected to one terminal of the capacitor C1 such that the capacitor C1 is charged with the voltage VDD through the switch S4 of the on state. Also, one terminal of the capacitor C2 starts to be charged by a source current ISI1 supplied through the resistor R1 and the turned on transistor P1 from the voltage VDD through the on state switch S5. Accordingly, the voltage of the input node NIN starts to increase. That is, the modulation signal MDS1 starts to increase from the time T1. The capacitor C2 is charged by the source current ISI1 flowing through the resistor R1 and the transistor P1 from the voltage VDD during the period T1-T2.

If the modulation signal MDS1 that is increased at the time T2 reaches the cut-off pulse voltage COPV, the inverter INV2 recognizes the modulation signal MDS1 as the high level and inverts it thereby generating the second input signal IN2 of the low level. Also, the output inverter INV3 inverts the second input signal IN2 of the low level at the time T2 to generate the output signal OUT of the high level. Thus, the switch S4 and the switch S5 are turned off by the second input signal IN2 of the low level, and the switch S1, the switch S3, and the switch S6 are turned on by the output signal OUT of the high level.

The capacitor C1 is charged with the voltage VDD before the time T2, and the input node NIN is connected to the voltage VDD and one terminal of the capacitor C1 at the time T2 by the turn-on of the switch S1 and the switch S3. Accordingly, the voltage of the input node NIN, that is, the modulation signal MDS1, becomes the voltage VDD at the time T2.

In the first exemplary embodiment of the present invention, the switch S1 and the switch S4 are all included, however only the switch S4 of the two switches S1 and S4 may be included. The switch S1 is connected to the input node NIN through the drain-source resistance of the transistor P1 such that it may be difficult to directly increase the modulation signal MDS1 to the voltage VDD at the time T2. The capacitor C1 is charged with the voltage VDD before the time T2 through the switch S4 such that the input node NIN may directly have the voltage VDD at the time T2 at which the switch S3 is turned on. If the switch S5 is turned off and the switch S6 is turned on at the time T2, the capacitor C2 is discharged to the ground voltage.

During the period T2-T3, the voltage VDD is connected to the input node NIN through the transistor P1 that is turned on by the first input signal IN1 and the switch S1 that is turned on by the output signal OUT, and the capacitor C1 is connected to the input node NIN by the turned on switch S3. Accordingly, the modulation signal MDS1 is maintained at the voltage VDD, and the inverter INV2 inverts the modulation signal MDS1 to output the second input signal IN2 of the low level.

If the increasing edge of which the first input signal IN1 is increased to the high level is generated at the time T3, the transistor P1 is turned off and transistor N1 is turned on. The second input signal IN2 and the output signal OUT are respectively the low level and the high level at the time T3 such that the three switches S1, S3, and S6 are in the on state, and the three switches S2, S4, and S5 are in the off state.

The input node NIN is grounded through the turned on transistor N1 and the resistor R2 such that the capacitor C1 is discharged through the switch S1, the transistor N1 of the on state, and the resistor R2. Here, the sink current ISI1 is generated. That is, the modulation signal MDS1 starts to decrease from the time T3.

If the modulation signal MDS1 that is decreased at the time T4 reaches the cut-off pulse voltage OCPV, the inverter INV2 recognizes the modulation signal MDS1 as the low level, and inverts the modulation signal MDS1 to output the second input signal IN2 of the high level. The output inverter INV3 inverts the second input signal IN2 to output the output signal OUT of the low level. Thus, the switch S2, the switch S4, and the switch S5 are turned on by the second input signal IN2 of the high level, and the switch S1, the switch S3, and the switch S6 are turned off by the output signal OUT of the low level.

The capacitor C2 is discharged to the ground voltage before the time T4, and the input node NIN is connected to one terminal of the ground and the capacitor C2 at the time T4 by the turn-on of the switch S2 and the switch S5. Accordingly, the voltage of the input node NIN, that is, the modulation signal MDS1, becomes the ground voltage at the time T4.

In the first exemplary embodiment of the present invention, the switch S2 and the switch S6 are all included, however the switch S6 of the two switches S2 and S6 may only be included. The switch S2 is connected to the input node NIN through the drain-source resistance of the transistor N1 such that it may be difficult to directly decrease the modulation signal MDS1 to the ground voltage at the time T4. The capacitor C2 is discharged to the ground voltage through the switch S6 before the time T4 such that the input node NIN may directly have the ground voltage at the time T4 that the switch S5 is turned on. If the switch S3 is turned off and the switch S4 is turned on at the time T4, the capacitor C1 is charged to the voltage VDD.

The input node NIN is grounded during the period T4-T5 through the transistor N1 that is turned on by the first input signal IN1 and the switch S2 that is turned on by the second input signal IN2, and the capacitor C2 is connected to the input node NIN by the turned on switch S5. Accordingly, the modulation signal MDS1 is maintained as the ground voltage, and the inverter INV2 inverts the modulation signal MDS1 to output the second input signal IN2 of the high level.

The periods T1-T5 are again repeated such that the operation description after the time T5 is omitted.

As described above, the pulse width filter 1 according to the first exemplary embodiment of the present invention generates the modulation signal that is increased and decreased in synchronization with the edge time of the input signal IN, and if the modulation signal reaches the cut-off pulse voltage, the input signal IN is determined as the pulse of more than the cut-off pulse width and is transmitted.

That is, if the decreasing edge of the input signal IN is generated between the period T1-T2, the modulation signal MDS1 does not reach the cut-off pulse voltage such that the output signal OUT is not increased to the high level and is maintained as the low level.

Also, if the increasing edge of the input signal IN is generated between the period T3-T4, the modulation signal MDS1 does not reach the cut-off pulse voltage such that the output signal OUT is not decreased to the low level and is maintained as the high level.

Accordingly, in the case that the input signal IN is the short pulse that is decreased or increased within the increasing delay period or the decreasing delay period, it may be blocked in the first exemplary embodiment of the present invention. By this method, the pulse width filter according to the first exemplary embodiment of the present invention may prevent the distorted output signal.

Next, a pulse width filter according to the second exemplary embodiment of the present invention will be described with reference to FIGS. 3 and 4.

Figure 3:
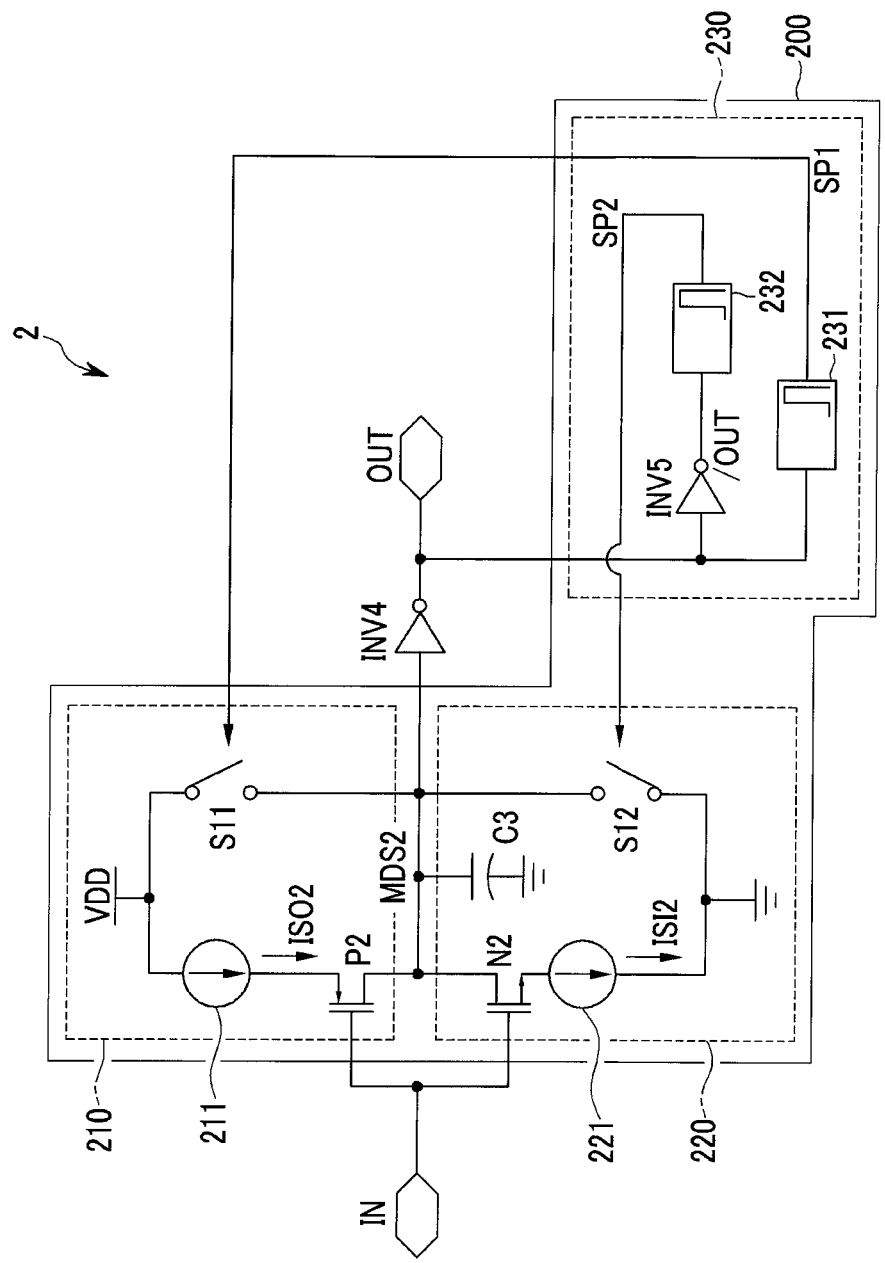
FIG. 3 is a view of a pulse width filter 2 according to the second exemplary embodiment of the present invention.
Figure 4:
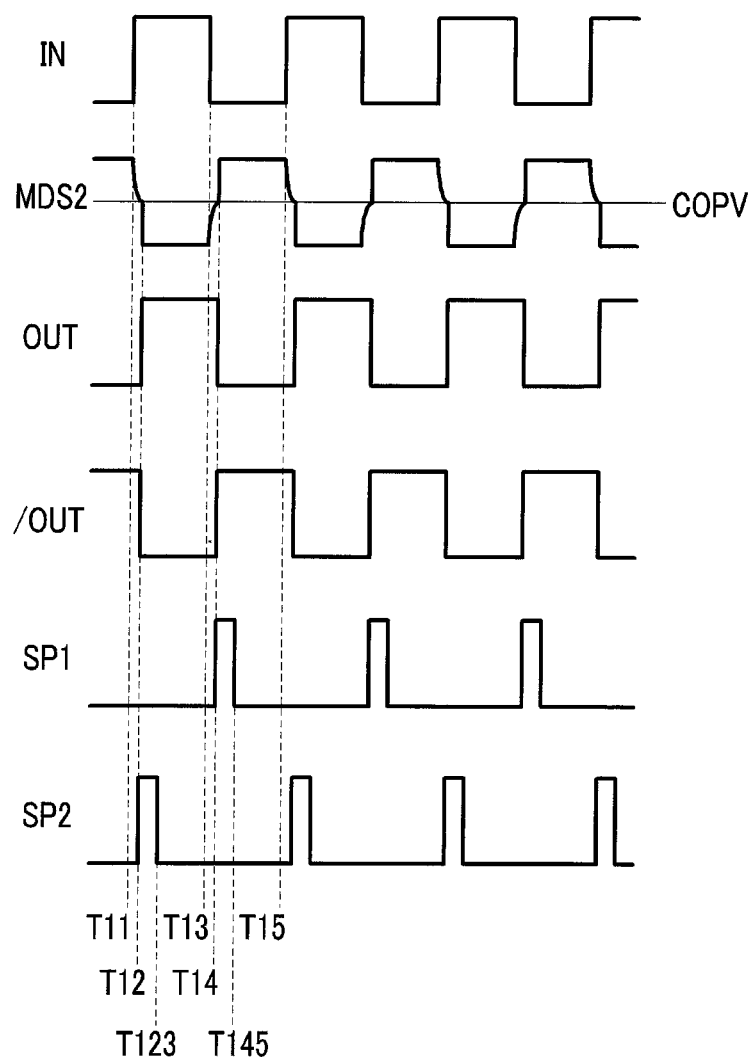
FIG. 4 is a waveform diagram to explain an operation of the pulse width filter 2.

FIG. 3 is a view of a pulse width filter 2 according to the second exemplary embodiment of the present invention. FIG. 4 is a waveform diagram to explain an operation of a pulse width filter 2.

A pulse width filter 2 according to the second exemplary embodiment of the present invention does not include the input inverter INV1, compared with the pulse width filter 1 according to the first exemplary embodiment.

The pulse width filter 2 includes a filter unit 200 and an output inverter INV4.

The function of the filter unit 200 is the same as the filter unit 100 of the first exemplary embodiment. However, the modulation signal MDS2 generated in the filter unit 200 has the opposite phase to the modulation signal MDS1 of the first exemplary embodiment. In detail, the modulation signal MDS2 is a waveform that is decreased in synchronization with the increasing edge of the input signal IN and is increased in synchronization with the decreasing edge of the input signal IN.

The output inverter INV4 inverts the modulation signal MDS2 to generate the output signal OUT. This is different from the output inverter INV3 inverting the second input signal IN2 in the first exemplary embodiment.

The filter unit 200 includes an increasing circuit 210 increasing and maintaining the modulation signal MDS2 in synchronization with the decreasing edge of the input signal IN, a decreasing circuit 220 decreasing and maintaining the modulation signal MDS2 in synchronization with the increasing edge of the input signal IN, a controller 230, and a capacitor C3.

The increasing circuit 210 charges the capacitor C3 by using at least one of the source current ISO2 and the voltage VDD according to the input signal IN and the pulse signal SP1. The pulse signal SP1 as the signal generated according to the output signal OUT is generated in the controller 230. A period in which the capacitor C3 is not connected to the voltage VDD and is charged by the source current ISO2 is referred to as an increasing delay period.

The increasing circuit 210 includes a current source 211, a transistor P2, and a switch S11. The transistor P2 includes the gate electrode transmitted with the input signal IN, the drain electrode connected to one terminal of the capacitor C3, and the source electrode connected to the current source 211. The switch S11 is connected between one terminal of the capacitor C3 and the voltage VDD, and is operated according to the pulse signal SP1. The current source 211 generates the source current ISO2 by using the voltage VDD.

The decreasing circuit 220 discharges the capacitor C3 by using at least one of the sink current ISI2 and the ground according to the input signal IN and the pulse signal SP2. The pulse signal SP2 as the signal generated according to the output signal OUT is generated in the controller 230. A period in which the capacitor C3 is not connected to the ground and is discharged by the sink current ISI2 is referred to as a decreasing delay period.

The decreasing circuit 220 includes a current source 221, a transistor N2, and a switch S12. The transistor N2 includes the gate electrode transmitted with the input signal IN, the drain electrode connected to one terminal of the capacitor C3, and the source electrode connected to the current source 221. The switch S12 is connected between one terminal of the capacitor C3 and the ground, and is operated according to the pulse signal SP2. The current source 221 generates the sink current ISI2 flowed in the ground.

The controller 230 generates the pulse signal SP1 and the pulse signal SP2 to control the operation the increasing circuit 210 and the decreasing circuit 220 according to the output signal. The controller 230 generates a pulse signal SP1 having the high level of a predetermined period in synchronization with the decreasing edge of the output signal OUT, and a pulse signal SP2 having the high level of a predetermined period in synchronization with the increasing edge of the output signal OUT.

The controller 230 includes an inverter INV5, a pulse generating unit 231, and a pulse generating unit 232. The inverter INV5 inverts the output signal OUT to transmit it to the pulse generating unit 232.

The pulse generating unit 231 receives the output signal OUT, and transmits the pulse signal SP1 of the high level to the switch S11 in synchronization with the decreasing edge of the output signal OUT. The switch S11 is turned on by the high level of the pulse signal SP1. The high level period of the pulse signal SP1 is sufficient for charging the capacitor C3 to the voltage VDD.

The pulse generating unit 232 receives the inverted output signal /OUT, and transmits the pulse signal SP2 of the high level to the switch S12 in synchronization with the decreasing edge of the inverted output signal /OUT. The switch S12 is turned on by the high level of the pulse signal SP2. The high level period of the pulse signal SP2 is sufficient for discharging the capacitor C3 to the ground voltage. When the pulse generating unit 232 may generate the pulse signal SP2 of the high level of the predetermined period in synchronization with the increasing edge, the controller 230 does not include the inverter INV5.

In the case that the high level period of the pulse signal SP1 is similar to the pulse width of the input signal IN or more, the error that the increasing circuit 210 and the decreasing circuit 220 are connected together to the capacitor C3 may be generated. The high level period of the pulse signal SP1 must be determined as a shorter period than the pulse width of the input signal IN. The high level period of the pulse signal SP2 is also the same.

The voltage determined by the charge charged in the capacitor C3, that is, the voltage of one terminal of the capacitor C3, becomes the modulation signal MDS2.

Next, an operation of the pulse width filter 2 according to the second exemplary embodiment of the present invention will be described with reference to FIG. 4.

The increasing edge of the input signal IN is generated at the time T11, and is maintained as the high level during the period T11-T13. If the input signal IN is increased and is the high level at the time T11, the transistor P2 is turned off and the transistor N2 is turned on. Here, the output signal OUT is the low level, and the switch S11 and the switch S12 are in the turned off state.

One terminal of the capacitor C3 starts to be discharged by the sink current ISI2 through the turned on transistor N2 from the time T11. Accordingly, the modulation signal MDS2 starts to be decreased from the time T11. The capacitor C3 is discharged by the sink current ISI2 during the period T11-T12.

At the time T12, if the decreased modulation signal MDS2 reaches the cut-off pulse voltage COPV, the output inverter INV4 recognizes the modulation signal MDS2 as the low level, and inverts it to generate the output signal OUT of the high level.

The pulse generating unit 232 generates the pulse signal SP2 having the high level during the period T12-T123 in synchronization with the decreasing edge of the inverse output signal /OUT passing through the inverter INV5. If the switch S12 is turned on at the time T12, one terminal of the capacitor C3 is grounded such that the modulation signal MDS2 becomes the ground voltage. The switch S12 is maintained in the on state during the period T12-T123.

The decreasing edge of the input signal IN is generated at the time T13, and is maintained as the low level during the period T13-T15. If the input signal IN is decreased and becomes the low level at the time T13, the transistor P2 is turned on and the transistor N2 is turned off. Here, the output signal OUT is the high level, and the switch S11 and the switch S12 are in the turned off state.

One terminal of the capacitor C3 starts to be charged by the source current ISO2 through the turned on transistor P2 from the time T13. Accordingly, the modulation signal MDS2 starts to increase from the time T13. The capacitor C3 is charged by the source current ISO2 during the period T13-T14.

At the time T14, if the increased modulation signal MDS2 reaches the cut-off pulse voltage COPV, the output inverter INV4 recognizes the modulation signal MDS2 as the high level, and inverts it to generate the output signal OUT of the low level.

The pulse generating unit 231 generates the pulse signal SP1 having the high level during the period T14-T145 in synchronization with the decreasing edge of the output signal OUT. If the switch S11 is turned on at the time T14, one terminal of the capacitor C3 is connected to the voltage VDD such that the modulation signal MDS2 becomes the voltage VDD.

The operation after the time T15 is repeated by the operation of the period T11-T15 such that a detailed description is omitted.

As described above, the pulse width filter according to the second exemplary embodiment of the present invention generates the modulation signal that is increased and decreased in synchronization with the edge time of the input signal IN, and if the modulation signal reaches the cut-off pulse voltage, the input signal IN is determined as the pulse that is more than the cut-off pulse width and thereby transmits it.

That is, if the decreasing edge of which the input signal IN is decreased to the low level between the period T11-T12 is generated, the modulation signal MDS2 does not reach the cut-off pulse voltage, and the output signal OUT is not increased into the high level and is maintained at the low level.

Also, if the increasing edge of which the input signal IN is increased to the high level is generated between the period T13-T14, the modulation signal MDS2 does not reach the cut-off pulse voltage such that the output signal OUT is not decreased to the low level, and is maintained at the high level.

Accordingly, in the case that the input signal IN is the short pulse that is decreased or increased within the increasing delay period or the decreasing delay period, it may be blocked in the second exemplary embodiment of the present invention. By this method, the pulse width filter according to the second exemplary embodiment of the present invention may prevent the distorted output signal.

Next, a pulse width filter 3 according to the third exemplary embodiment of the present invention will be described with reference to FIGS. 5 and 6.

Figure 5:
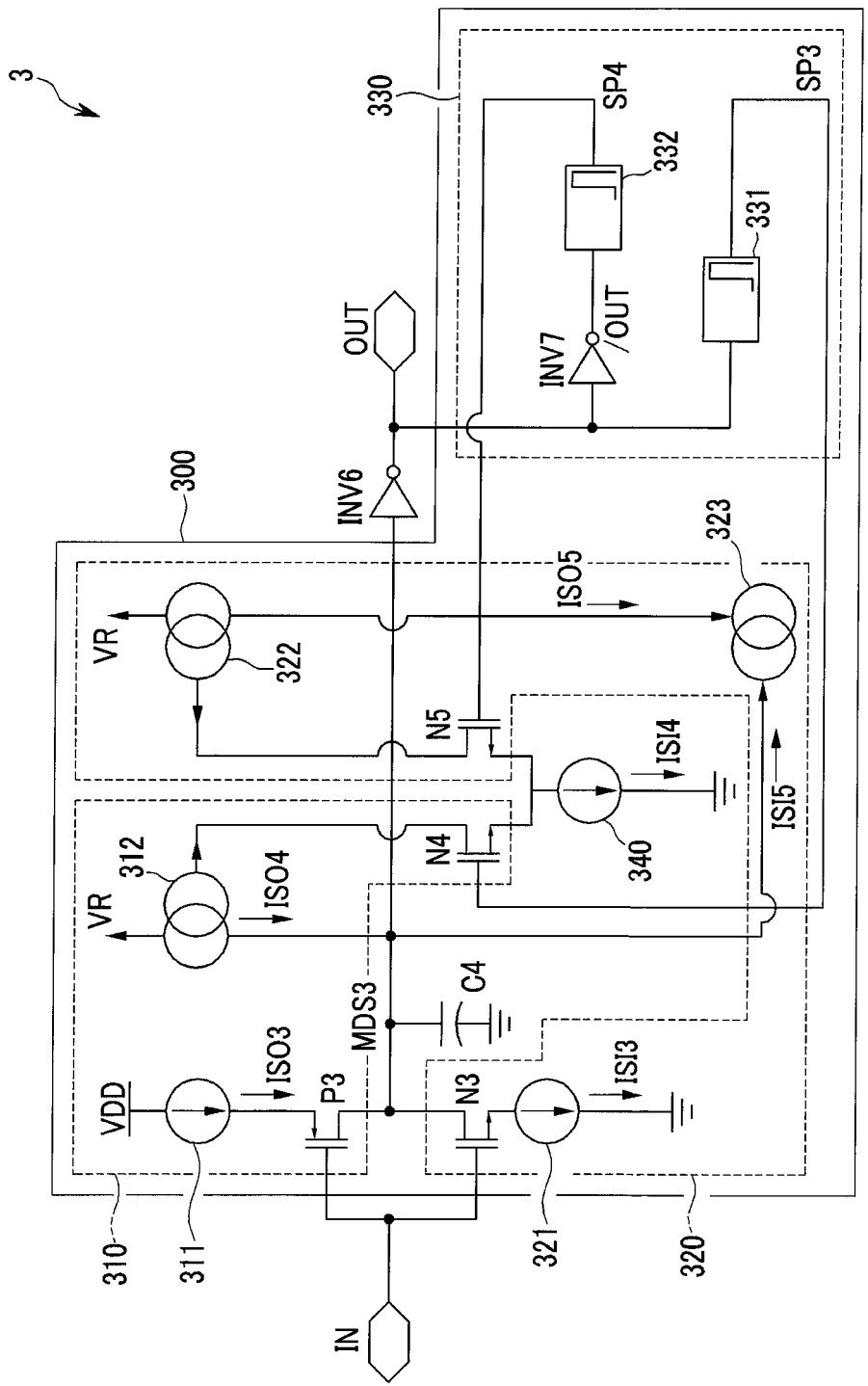
FIG. 5 is a view of a pulse width filter 3 according to third first exemplary embodiment of the present invention.
Figure 6:
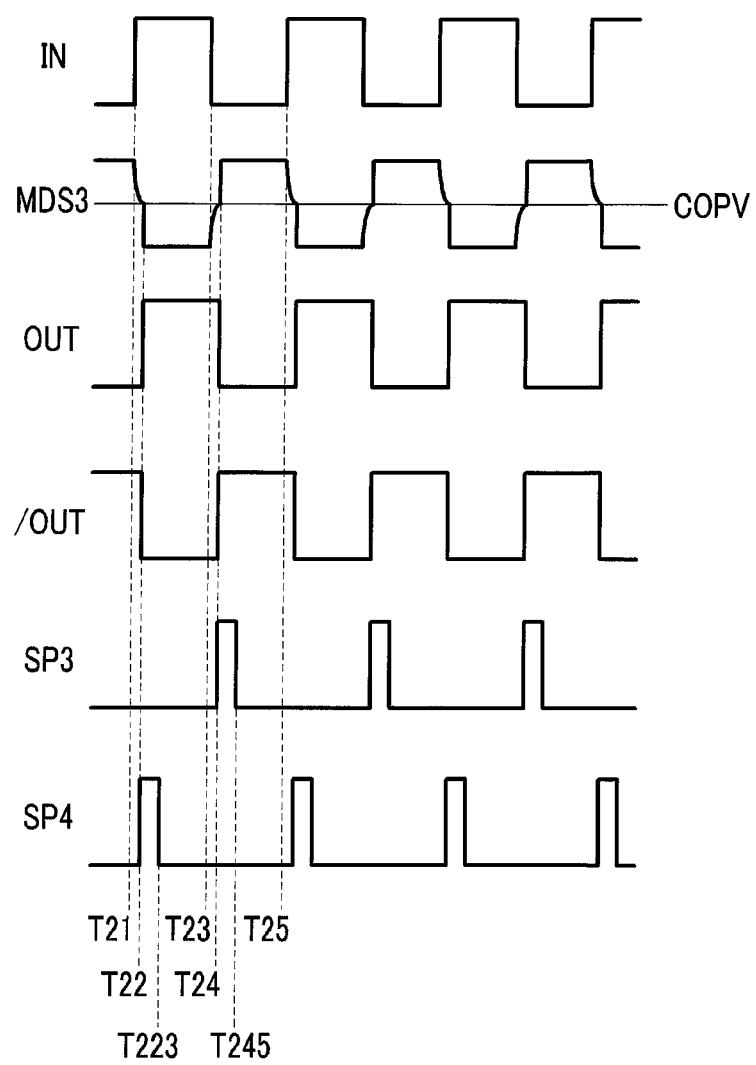
FIG. 6 is a waveform diagram to explain an operation of the pulse width filter 3.

FIG. 5 is a view of a pulse width filter 3 according to the third exemplary embodiment of the present invention. FIG. 4 is a waveform diagram to explain an operation of the pulse width filter 3.

A pulse width filter 3 according to the third exemplary embodiment of the present invention does not include the input inverter INV1, compared with the pulse width filter 1 according to the first exemplary embodiment.

The pulse width filter 3 includes a filter unit 300 and an output inverter INV6.

The function of the filter unit 300 is the same as the filter unit 100 of the first exemplary embodiment. However, the modulation signal MDS3 generated in the filter unit 300 has the opposite phase to the modulation signal MDS1 of the first exemplary embodiment. In detail, the modulation signal MDS3 is a waveform that is decreased in synchronization with the increasing edge of the input signal IN and is increased in synchronization with the decreasing edge of the input signal IN.

The output inverter INV6 inverts the modulation signal MDS3 to generate the output signal OUT.

The filter unit 300 includes an increasing circuit 310 increasing and maintaining the modulation signal MDS3, a decreasing circuit 320 decreasing and maintaining the modulation signal MDS3, a controller 330, a capacitor C4, and a current source ISO5.

The increasing circuit 310 charges the capacitor C4 by using at least one of the source current ISO3 and the sink current ISI4 according to the input signal IN and the pulse signal SP3. The pulse signal SP3 as a signal generated according to the output signal OUT is generated in the controller 330. A period in which the capacitor C4 is only charged by the source current ISO3 is referred to as an increasing delay period.

The increasing circuit 310 includes a current source 311, a transistor P3, transistor N4, and a current mirror unit current mirror 312. The transistor P2 includes a gate electrode transmitted with the input signal IN, a drain electrode connected to one terminal of the capacitor C4, and a source electrode connected to the current source 311. The transistor N4 includes a gate electrode transmitted with the pulse signal SP3, a source electrode connected to the current source 340 generating the sink current ISI4, and a drain electrode connected to the current mirror unit 312. The current mirror unit 312 generates the source current ISO4 by mirroring the sink current ISI4 during the on period of the transistor N4, and transmits it to the capacitor C4.

The decreasing circuit 320 discharges the capacitor C4 by using at least one of the sink current ISI3 and the sink current ISI4 according to the input signal IN and the pulse signal SP4. The pulse signal SP4 as a signal generated according to the output signal OUT is generated in the controller 330. A period in which the capacitor C4 is only discharged by the sink current ISI3 is referred to as a decreasing delay period.

The decreasing circuit 320 includes a current source 321, a transistor N2, a transistor N5, and two current mirror units 322 and 323. The transistor N3 includes a gate electrode transmitted with the input signal IN, a drain electrode connected to one terminal of the capacitor C4, and a source electrode connected to the current source 321. The transistor N5 includes a gate electrode transmitted with the pulse signal SP4, a source electrode connected to the current source 340 generating the sink current ISI4, and a drain electrode connected to the current mirror unit 322. The current mirror unit 322 generates the source current ISO5 by mirroring the sink current ISI4 during the on period of the transistor N5, and transmits it to the current mirror unit 323. The current mirror unit 323 generates the sink current ISI5 flowing from the capacitor C4 by mirroring the source current ISO5. That is, the current mirror unit 323 converts the source current ISO5 input to the capacitor C4 into the sink current ISI5.

The controller 330 generates the pulse signal SP3 and the pulse signal SP4 to control the operation of the increasing circuit 310 and the decreasing circuit 320 according to the output signal OUT. The controller 330 generates a pulse signal SP3 having the high level during a predetermined period in synchronization with the decreasing edge of the output signal OUT and a pulse signal SP4 having the high level during a predetermined period in synchronization with the increasing edge of the output signal OUT.

The controller 330 includes an inverter INV7, a pulse generating unit 331, and a pulse generating unit 332. The inverter INV7 inverts the output signal OUT to transmit it to the pulse generating unit 332.

The pulse generating unit 331 receives the output signal OUT, and transmits the pulse signal SP3 of the high level to the transistor N4 in synchronization with the decreasing edge of the output signal OUT. The transistor N4 is turned on by the high level of the pulse signal SP3. The high level period of the pulse signal SP3 is sufficient for charging the capacitor C4 to the voltage (for example, the voltage VDD) that is more than the cut-off pulse voltage.

The pulse generating unit 332 receives the inverted output signal /OUT, and transmits the pulse signal SP4 of the high level to the transistor N5 in synchronization with the decreasing edge of the inverted output signal /OUT. The transistor N5 is turned on by the high level of the pulse signal SP4. The high level period of the pulse signal SP4 is sufficient for discharging the capacitor C4 to the voltage (for example, the ground voltage) that is less than the cut-off pulse voltage.

In the case that the pulse generating unit 332 can generate the pulse signal SP4 of the high level during a predetermined period in synchronization with the increasing edge, the controller 330 does not include the inverter INV7.

The voltage determined according to the charge charged in the capacitor C4, that is, the voltage of one terminal of the capacitor C4, becomes the modulation signal MDS3.

Next, an operation of the pulse width filter 3 according to the third exemplary embodiment of the present invention will be described with reference to FIG. 4.

The increasing edge of the input signal IN is generated at the time T21, and is maintained at the high level during the period T21-T23. If the input signal IN is increased and is the high level at the time T21, the transistor P3 is turned off and the transistor N3 is turned on. Here, the output signal OUT is the low level, and the transistor N4 and the transistor N5 are in the turned off state.

One terminal of the capacitor C4 starts to be discharged by the sink current ISI3 through the turned on transistor N3 from the time T21. Accordingly, the modulation signal MDS3 starts to be decreased from the time T21. The capacitor C4 is discharged by the sink current ISI3 during the period T21-T22.

At the time T22, if the decreased modulation signal MDS3 reaches the cut-off pulse voltage COPV, the output inverter INV6 recognizes the modulation signal MDS3 as the low level, and inverts it to generate the output signal OUT of the high level.

The pulse generating unit 332 generates the pulse signal SP4 having the high level during the period T22-T223 in synchronization with the decreasing edge of the inverse output signal /OUT passing through the inverter INV7. If the transistor N5 is turned on at the time T22, the capacitor C4 is quickly discharged by the sink current ISI5 of the current mirror unit 323 such that the modulation signal MDS2 becomes the ground voltage. The transistor N5 is maintained in the on state during the period T22-T223.

The decreasing edge of the input signal IN is generated at the time T23, and is maintained at the low level during the period T23-T25. If the input signal IN is decreased and becomes the low level at the time T23, the transistor P3 is turned on and the transistor N3 is turned off. Here, the output signal OUT is the high level, and the transistor N4 and the transistor N5 are in the turned off state.

One terminal of the capacitor C4 starts to be charged by the source current ISO3 supplied through the turned on transistor P3 from the time T23. Accordingly, the modulation signal MDS3 starts to increase from the time T23. The capacitor C4 is charged by the source current ISO3 during the period T23-T24.

At the time T24, if the increased modulation signal MDS3 reaches the cut-off pulse voltage COPV, the output inverter INV6 recognizes the modulation signal MDS3 as the high level, and inverts it to generate the output signal OUT of the low level.

The pulse generating unit 331 generates the pulse signal SP3 having the high level during the period T24-T245 in synchronization with the decreasing edge of the output signal OUT. If the transistor N4 is turned on at the time T24, the capacitor C4 is quickly charged by the source current ISO4 such that the modulation signal MDS3 becomes the voltage VDD.

The operation after the time T25 is repeated by the operation of the period T21-T25 such that the detailed description is omitted.

As described above, the pulse width filter according to the third exemplary embodiment of the present invention generates the modulation signal that is increased and decreased in synchronization with the edge time of the input signal IN, and if the modulation signal reaches the cut-off pulse voltage, the input signal IN is determined as the pulse that is more than the cut-off pulse width, thereby transmitting it.

That is, if the decreasing edge of which the input signal IN is decreased to the low level between the period T21-T22 is generated, the modulation signal MDS3 does not reach the cut-off pulse voltage, the output signal OUT is not increased to the high level, and it is maintained as the low level.

Also, if the increasing edge of which the input signal IN is increased to the high level is generated between the period T23-T24, the modulation signal MDS3 does not reach the cut-off pulse voltage such that the output signal OUT is not decreased to the low level, and is maintained at the high level.

Accordingly, in the case that the input signal IN is the short pulse that is decreased or increased within the increasing delay period or the decreasing delay period, it may be blocked in the third exemplary embodiment of the present invention. By this method, the pulse width filter according to the third exemplary embodiment of the present invention may prevent the distorted output signal.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS pulse width filter: 1, 2, 3 filter unit: 100, 200, 300
inverter: INV1-INV7 transistor: N1-N5, P1-P3
switch: S1-S6, S11, S12 current source: 211, 221, 311, 321, 340
current mirror unit: 312, 322, 323 pulse generating unit: 231, 232, 331, 332
capacitor: C1-C4 resistor: R1, R2

What is claimed is:

1. A pulse width filter comprising:
a filter unit generating a modulation signal that is increased in synchronization with one of an increasing edge and a decreasing edge of an input signal and decreased in synchronization with one of the increasing edge and the decreasing edge, and transmitting the input signal through the filter unit according to the modulation signal; and
an output inverter inverting the input signal passing through the filter unit to generate an output signal,
wherein the increasing and the decreasing of the modulation signal is controlled according to the input signal as passed through the output inverter and the filter unit, and the modulation signal indicates whether the pulse width of the input signal is wider than a predetermined cut-off pulse width.

2. The pulse width filter of claim 1, wherein the filter unit includes:
an increasing circuit supplying a source current or a first voltage to a first input signal inverting the input signal and the output signal;
a decreasing circuit supplying a sink current or a second voltage according to the first input signal and a second input signal that is an input signal passing through the filter unit; and
a controller receiving the source current, the sink current, the first voltage, and the second voltage according to the second input signal and the output signal to generate the modulation signal.

3. The pulse width filter of claim 2, wherein the controller increases the modulation signal by using the source current in synchronization with the increasing edge of the input signal, and decreases the modulation signal by using the sink current in synchronization with the decreasing edge of the input signal.

4. The pulse width filter of claim 3, wherein the controller increases the modulation signal during an increasing delay period by using the source current in synchronization with the increasing edge of the input signal, and then maintains the modulation signal as a first voltage, and decreases the modulation signal during a decreasing delay period by using the sink current in synchronization with the decreasing edge of the input signal, and then maintains the modulation signal as the second voltage when the input signal is more than the cut-off pulse width.

5. The pulse width filter of claim 3, wherein the increasing circuit includes:
a first transistor including a gate electrode transmitted with the first input signal, a drain electrode connected to the controller, and source electrode; and
a first resistor including one terminal connected to the first voltage and the other terminal connected to the source electrode of the first transistor,
wherein the first transistor is turned on by the first level of the first input signal.

6. The pulse width filter of claim 3, wherein the decreasing circuit includes:
a second transistor including a gate electrode transmitted with the first input signal, a drain electrode connected to the controller, and a source electrode; and
a second resistor including one terminal connected to the second voltage and the other terminal connected to the source electrode of the second transistor,
wherein the second transistor is turned on by the second level of the first input signal.

7. The pulse width filter of claim 6, wherein the controller includes:
a first capacitor;
a second capacitor;
a first switch including one terminal connected to an input node connected to the increasing circuit and the decreasing circuit and the other terminal connected to one terminal of the first capacitor, and switched according to the output signal;
a second switch including one terminal input with the first voltage and the other terminal connected to one terminal of the first capacitor, and switched according to the second input signal;
a third switch including one terminal connected to the input node and the other terminal connected to one terminal of the second capacitor, and switched according to the second input signal;
a fourth switch connected in parallel to the second capacitor and switched according to the output signal; and
an inverter including an input terminal connected to the input node and an output terminal connected to the output node connected to the output inverter,
wherein the voltage of the input node is the modulation signal, and the modulation signal is inverted through the inverter thereby being the second input signal.

8. The pulse width filter of claim 7, wherein the decreasing circuit includes one terminal connected to the second voltage and the other terminal connected to the source electrode of the second transistor, and further includes a switch operated according to the second input signal.

9. The pulse width filter of claim 7, wherein the increasing circuit includes one terminal connected to the first voltage and the other terminal connected to the source electrode of the first transistor, and further includes a switch operated according to the output signal.

10. The pulse width filter of claim 7, wherein the inverter inverts the modulation signal to generate the second input signal of the low level when the increasing modulation signal reaches the cut-off pulse voltage corresponding to the cut-off pulse width, and the inverter inverts the modulation signal to generate the second input signal of the high level when the decreasing modulation signal reaches the cut-off pulse voltage.

11. The pulse width filter of claim 1, wherein the filter unit includes:
an increasing circuit increasing the modulation signal in synchronization with the decreasing edge of the input signal;
a decreasing circuit decreasing the modulation signal in synchronization with the increasing edge of the input signal;

a controller generating the first pulse signal and the second pulse signal output signal controlling the operation of the increasing circuit and the decreasing circuit; and a capacitor connected to the increasing circuit and the decreasing circuit.

12. The pulse width filter of claim 11, wherein the controller generates the first pulse signal having the high level of a predetermined period in synchronization with the decreasing edge of the output signal, and generates the second pulse signal having the high level of a predetermined period in synchronization with the increasing edge of the output signal.

13. The pulse width filter of claim 12, wherein the increasing circuit charges the capacitor by using at least one of a source current and a first voltage according to the input signal and the first pulse signal.

14. The pulse width filter of claim 13, wherein the increasing circuit includes:

a current source supplying the source current;

a transistor including a gate electrode transmitted with the input signal, a drain electrode connected to one terminal of the capacitor, and a source electrode connected to the current source; and a switch connected between one terminal of the capacitor and the first voltage, and switch-operated according to the first pulse signal.

15. The pulse width filter of claim 12, wherein the decreasing circuit discharges the capacitor by using at least one of a sink current and a second voltage according to the input signal and the second pulse signal.

16. The pulse width filter of claim 15, wherein the decreasing circuit includes:

a current source generating the sink current;

a transistor including a gate electrode transmitted with the input signal, a drain electrode connected to one terminal of the capacitor, and a source electrode connected to the current source; and a switch connected between one terminal of the capacitor and the second voltage, and operated according to the second pulse signal.

17. The pulse width filter of claim 12, wherein the increasing circuit charges the capacitor by using at least one of the a first source current and a first sink current according to the input signal and the first pulse signal.

18. The pulse width filter of claim 17, wherein the increasing circuit includes:

a current source generating the first source current;

a current mirror unit mirroring the first sink current to generate a second source current;

a first transistor including a gate electrode transmitted with the input signal, a drain electrode connected to one terminal of the capacitor, and a source electrode connected to the current source; and a second transistor including a gate electrode transmitted with the first pulse signal, a source electrode connected to a sink current source generating the first sink current, and a drain electrode connected to the current mirror unit.

19. The pulse width filter of claim 18, wherein the current mirror unit mirrors the first sink current during the on period of the second transistor to generate the second source current, and transmits the second source current to the capacitor.

20. The pulse width filter of claim 12, wherein the decreasing circuit discharges the capacitor by using at least one of a first sink current and a second sink current according to the input signal and the second pulse signal.

21. The pulse width filter of claim 20, wherein the decreasing circuit includes:

a current source generating the first sink current;

a first current mirror unit mirroring the second sink current to generate a first source current;

a second current mirror unit mirroring the first source current to generate a third sink current;

a first transistor including a gate electrode transmitted with the input signal, a drain electrode connected to one terminal of the capacitor, and a source electrode connected to the current source; and a second transistor including a gate electrode transmitted with the second pulse signal, a source electrode connected to a sink current source generating the second sink current, and a drain electrode connected to the first current mirror unit.

22. The pulse width filter of claim 21, wherein the first current mirror unit mirrors the second sink current to generate the first source current during an on period of the second transistor and transmits it the second current mirror unit, and the second current mirror unit mirrors the first source current to generate the third sink current flowing from the capacitor.

* * * * *